(12) United States Patent
Kim (10) Patent No.: US 8,766,694 B2
(45) Date of Patent: Jul. 1, 2014

(54) PULSE SHIFTING CIRCUIT AND SEMICONDUCTOR INTEGRATED CIRCUIT

(75) Inventor: Je Yoon Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,149

(22) Filed: Sep. 1, 2012

(65) Prior Publication Data

US 2013/0222030 A1    Aug. 29, 2013

(30) Foreign Application Priority Data

Feb. 27, 2012    (KR) .................. 10-2012-0019576

(51) Int. Cl.
*H03H 11/26* (2006.01)

(52) U.S. Cl.
USPC ............................ 327/285; 327/288; 327/525

(58) Field of Classification Search
USPC .......... 327/261, 271, 272, 284, 285, 288, 525; 365/225.7
See application file for complete search history.

(56) References Cited

U.S. PATENT DOCUMENTS

| 7,684,266 B2 * | 3/2010 | Lee ........................... 365/200 |
| 2008/0043898 A1 * | 2/2008 | Kim ............................ 377/75 |
| 2013/0027095 A1 * | 1/2013 | Kim et al. .................. 327/142 |

FOREIGN PATENT DOCUMENTS

KR    10-2008-0074670 A    8/2008

* cited by examiner

*Primary Examiner* — Quan Tra
(74) *Attorney, Agent, or Firm* — William Park & Associates Patent Ltd.

(57) ABSTRACT

A semiconductor integrated circuit includes a rupture instructing pulse generation unit configured to generate a rupture instructing pulse signal in response to a fuse rupture command signal and an address; a first anti-fuse rupture unit configured to perform an operation for rupturing a first anti-fuse during an enable period of the rupture instructing pulse signal, and generate rupture information of the first anti-fuse; a pulse shifting unit configured to delay the rupture instructing pulse signal and generate a delayed rupture instructing pulse signal; and a second anti-fuse rupture unit configured to perform an operation for rupturing a second anti-fuse during an enable period of the delayed rupture instructing pulse signal, and generate rupture information of the second anti-fuse.

7 Claims, 4 Drawing Sheets

PULSE SHIFTING CIRCUIT AND SEMICONDUCTOR INTEGRATED CIRCUIT

CROSS-REFERENCES TO RELATED APPLICATION

The present application claims priority under 35 U.S.C. §119(a) to Korean application number 10-2012-0019576, filed on Feb. 27, 2012, in the Korean Intellectual Property Office, which is incorporated herein by reference in its entirety.

BACKGROUND

1. Technical Field

The present invention relates to a semiconductor integrated circuit, and more particularly, to a circuit for rupturing an anti-fuse.

2. Related Art

A semiconductor integrated circuit undergoes a test, and setting values of an internal circuit are determined according to the test result. The semiconductor integrated circuit includes a fuse circuit for fixing the setting values (a delay value, a voltage level of an internal voltage, a redundancy address, etc.) of the internal circuit according to the test result.

In general, in the fuse circuit, it is determined whether to cut a fuse associated with a test when changing the setting values according to the test result. In this regard, a method of cutting a fuse using a laser has been adopted. However, in the method of cutting a fuse using a laser, since a fuse cutting process should be included in a procedure for manufacturing a semiconductor integrated circuit, a manufacturing time is lengthened.

Currently, a method of rupturing a fuse by applying a high voltage to the fuse has been adopted. Nevertheless, the method of rupturing a fuse by applying a high voltage to the fuse has a disadvantage in that fuse rupture reliability is likely to be degraded.

Figure 1:
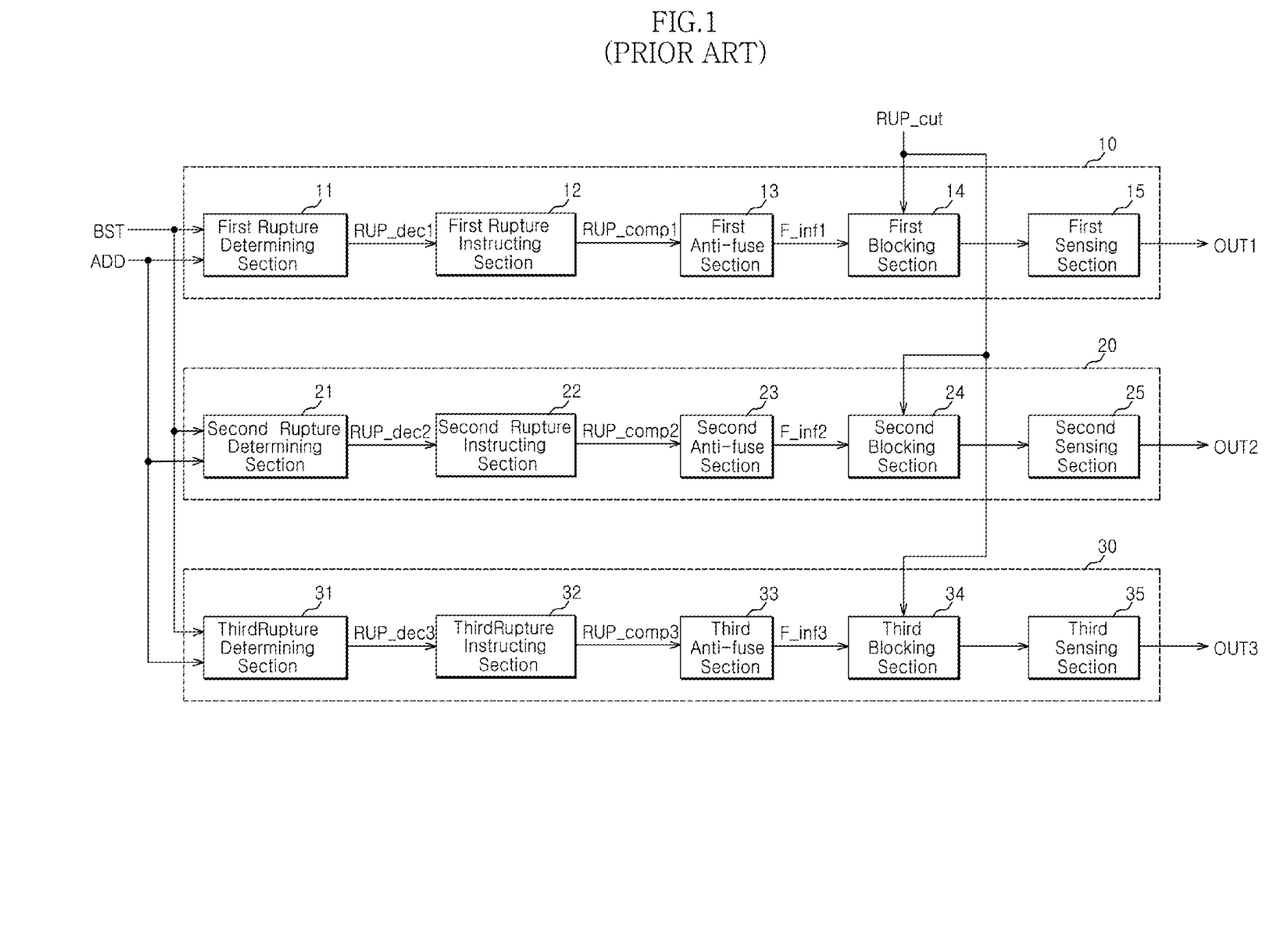
FIG. 1 is a configuration diagram of a conventional semiconductor integrated circuit.

In order to improve fuse rupture reliability, a method of rupturing fuses by applying a high voltage to a plurality of fuses as shown in FIG. 1 has been suggested.

Referring to FIG. 1, a conventional semiconductor integrated circuit includes first to third anti-fuse setting units 10, 20 and 30.

The first anti-fuse setting unit 10 includes a first rupture determining section 11, a first rupture instructing section 12, a first anti-fuse section 13, a first blocking section 14, and a first sensing section 15.

The first rupture determining section 11 determines whether to rupture a fuse, in response a fuse rupture command signal BST and an address ADD, and outputs a determination result as a first rupture determination signal RUP_dec1.

The first rupture instructing section 12 generates a first rupture instructing pulse signal RUP_comp1 in response to the first rupture determination signal RUP_dec1.

The first anti-fuse section 13 ruptures an anti-fuse in response to the first rupture instructing pulse signal RUP_comp1, and generates rupture information of the fuse as a first fuse information signal F_inf1. The first anti-fuse section 13 ruptures an anti-fuse by simultaneously applying a high voltage (for example, a positive pumping voltage) and a low voltage (for example, a negative pumping voltage) to both ends of the anti-fuse during the enable period of the first rupture instructing pulse signal RUP_comp1.

In response to a rupture period blocking signal RUP_cut, the first blocking section 14 prevents the high voltage used during the period in which the first anti-fuse section 13 ruptures the anti-fuse, from being transferred to the first sensing section 15.

The first sensing section 15 senses the first fuse information signal F_inf1 transferred through the first blocking section 14 from the first anti-fuse section 13, and outputs a sensing result as a first output signal OUT1.

The second anti-fuse setting unit 20 includes a second rupture determining section 21, a second rupture instructing section 22, a second anti-fuse section 23, a second blocking section 24, and a second sensing section 25.

The second rupture determining section 21 determines whether to rupture a fuse, in response to the fuse rupture command signal BST and the address ADD, and outputs a determination result as a second rupture determination signal RUP_dec2.

The second rupture instructing section 22 generates a second rupture instructing pulse signal RUP_comp2 in response to the second rupture determination signal RUP_dec2.

The second anti-fuse section 23 ruptures an anti-fuse in response to the second rupture instructing pulse signal RUP_comp2, and generates the rupture information of the fuse as a second fuse information signal F_inf2. The second anti-fuse section 23 ruptures an anti-fuse by simultaneously applying a high voltage (for example, a positive pumping voltage) and a low voltage (for example, a negative pumping voltage) to both ends of the anti-fuse during the enable period of the second rupture instructing pulse signal RUP_comp2.

In response to the rupture period blocking signal RUP_cut, the second blocking section 24 prevents the high voltage used during the period in which the second anti-fuse section 23 ruptures the anti-fuse from being transferred to the second sensing section 25.

The second sensing section 25 senses the second fuse information signal F_inf2 transferred through the second blocking section 24 from the second anti-fuse section 23, and outputs a sensing result as a second output signal OUT2.

The third anti-fuse setting unit 30 includes a third rupture determining section 31, a third rupture instructing section 32, a third anti-fuse section 33, a third blocking section 34, and a third sensing section 35.

The third rupture determining section 31 determines whether to rupture a fuse, in response to the fuse rupture command signal BST and the address ADD, and outputs a determination result as a third rupture determination signal RUP_dec3.

The third rupture instructing section 32 generates a third rupture instructing pulse signal RUP_comp3 in response to the third rupture determination signal RUP_dec3.

The third anti-fuse section 33 ruptures a fuse in response to the third rupture instructing pulse signal RUP_comp3, and generates the rupture information of the fuse as a third fuse information signal F_inf3. The third anti-fuse section 33 ruptures an anti-fuse by simultaneously applying a high voltage and a low voltage to both ends of the anti-fuse during the enable period of the third rupture instructing pulse signal RUP_comp3.

In response to the rupture period blocking signal RUP_cut, the third blocking section 34 prevents the high voltage used during the period in which the third anti-fuse section 33 ruptures the anti-fuse from being transferred to the third sensing section 35.

The third sensing section 35 senses the third fuse information signal F_inf3 transferred through the third blocking section 34 from the third anti-fuse section 33, and outputs a sensing result as a third output signal OUT3.

As the above descriptions show, in the conventional semiconductor integrated circuit for rupturing an anti-fuse in order to rupture a plurality of anti-fuses, there needs to be the same number of anti-fuse setting units as anti-fuses. Because the plurality of anti-fuse setting units have the same configuration are needed, an area that is taken up by anti-fuse units increases.

SUMMARY

In one embodiment of the present invention, a semiconductor integrated circuit includes: a rupture instructing pulse generation unit configured to generate a rupture instructing pulse signal in response to a fuse rupture command signal and an address; a first anti-fuse rupture unit configured to perform an operation for rupturing a first anti-fuse during an enable period of the rupture instructing pulse signal, and generate rupture information of the first anti-fuse; a pulse shifting unit configured to delay the rupture instructing pulse signal and generate a delayed rupture instructing pulse signal; and a second anti-fuse rupture unit configured to perform an operation for rupturing a second anti-fuse during an enable period of the delayed rupture instructing pulse signal, and generate rupture information of the second anti-fuse.

In another embodiment of the present invention, a pulse shifting circuit includes: a first charging/discharging section configured to charge/discharge a first capacitor in response to an input pulse signal and a comparison signal; a second charging/discharging section configured to charge/discharge a second capacitor in response to the input pulse signal; a comparing section configured to compare voltage levels of the first capacitor and the second capacitor, and generate the comparison signal; and a signal generating section configured to generate a delayed pulse signal which is enabled at disable timing of the input pulse signal and has the substantially same enable period as an enable period of the input pulse signal, in response to the comparison signal and the input pulse signal.

In another embodiment of the present invention, a pulse shifting circuit includes: a charging/discharging section configured to lower a voltage level of a first capacitor during an enable period of an input pulse signal, and lower a voltage level of a second capacitor when the input pulse signal is disabled; a comparing section configured to enable a comparison signal when a voltage level of the first capacitor becomes higher than a voltage level of the second capacitor; and a signal generating section configured to enable a delayed pulse signal when the input pulse signal is disabled, and disable the delayed pulse signal when the comparison signal is enabled.

BRIEF DESCRIPTION OF THE DRAWINGS

Features, aspects, and embodiments are described in conjunction with the attached drawings, in which.

DETAILED DESCRIPTION

Hereinafter, a pulse shifting circuit and a semiconductor integrated circuit according to the present invention will be described below with reference to the accompanying drawings through example embodiments.

Figure 2:
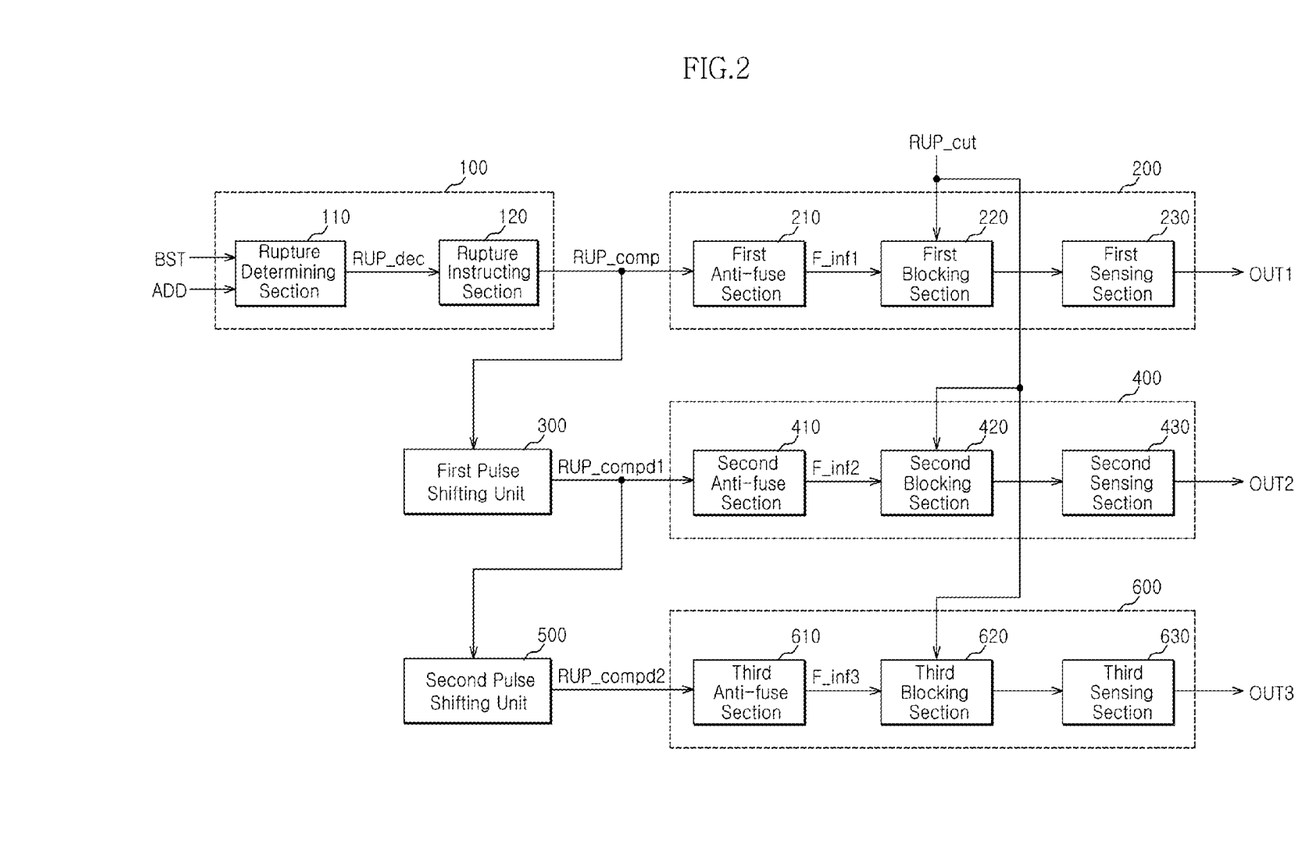
FIG. 2 is a configuration diagram of a semiconductor integrated circuit in accordance with an embodiment of the present invention.

Referring to FIG. 2, a pulse shifting circuit and a semiconductor integrated circuit in accordance with an embodiment of the present invention may include a rupture instructing pulse generation unit 100, a first anti-fuse rupture unit 200, a first pulse shifting unit 300, a second anti-fuse rupture unit 400, a second pulse shifting unit 500, and a third anti-fuse rupture unit 600.

The rupture instructing pulse generation unit 100 is configured to generate a rupture instructing pulse signal RUP_comp in response to a fuse rupture command signal BST and an address ADD. For example, the rupture instructing pulse generation unit 100 may include a rupture determining section 110, and a rupture instructing section 120. The rupture determining section 110 is configured to decode the fuse rupture command signal BST and the address ADD, and enable a fuse rupture determination signal RUP_dec. The rupture determining section 110 may be constituted by a decoder. The rupture instructing section 120 is configured to generate the rupture instructing pulse signal RUP_comp when the fuse rupture determination signal RUP_dec is enabled. The rupture instructing section 120 may be constituted by a pulse generation circuit.

The first anti-fuse rupture unit 200 is configured to perform an operation for rupturing a first anti-fuse during the enable period of the rupture instructing pulse signal RUP_comp, generate rupture information F_inf1 of the first anti-fuse, and output a first output signal OUT1.

The first anti-fuse rupture unit 200 includes a first anti-fuse section 210, a first blocking section 220, and a first sensing section 230.

The first anti-fuse section 210 is configured to perform a rupturing operation by applying preset voltages (for example, a positive pumping voltage and a negative pumping voltage) to the first anti-fuse during the enable period of the rupture instructing pulse signal RUP_comp. The first anti-fuse section 210 having completed the rupturing operation outputs the rupture information of the first anti-fuse as a first fuse information signal F_inf1.

The first blocking section 220 is configured to prevent the preset voltages applied to the first anti-fuse from being transferred to the first sensing section 230, in response to a rupture period blocking signal RUP_cut. For example, the first blocking section 220 is interposed between the first anti-fuse section 210 and the first sensing section 230. The first blocking section 220 isolates the first anti-fuse section 210 and the first sensing section 230 from each other while the preset voltages are applied to the first anti-fuse in the first anti-fuse section 210 (during the enable period of the rupture period blocking signal RUP_cut). The first blocking section 220 connects the first anti-fuse section 210 and the first sensing section 230 with each other while the preset voltages are not applied to the first anti-fuse in the first anti-fuse section 210 (during the disable period of the rupture period blocking signal RUP_cut).

The first sensing section 230 is configured to sense the rupture information of the first anti-fuse, that is, the first fuse information signal F_inf1, and output a sensing result as the first output signal OUT1.

The first pulse shifting unit 300 is configured to delay the rupture instructing pulse signal RUP_comp and generate a first delayed rupture instructing pulse signal RUP_compd1. For example, the first pulse shifting unit 300 generates the first delayed rupture instructing pulse signal RUP_compd1, which is enabled at the disable timing of the rupture instructing pulse signal RUP_comp and has the substantially same enable period as the enable period of the rupture instructing pulse signal RUP_comp.

Figure 3:
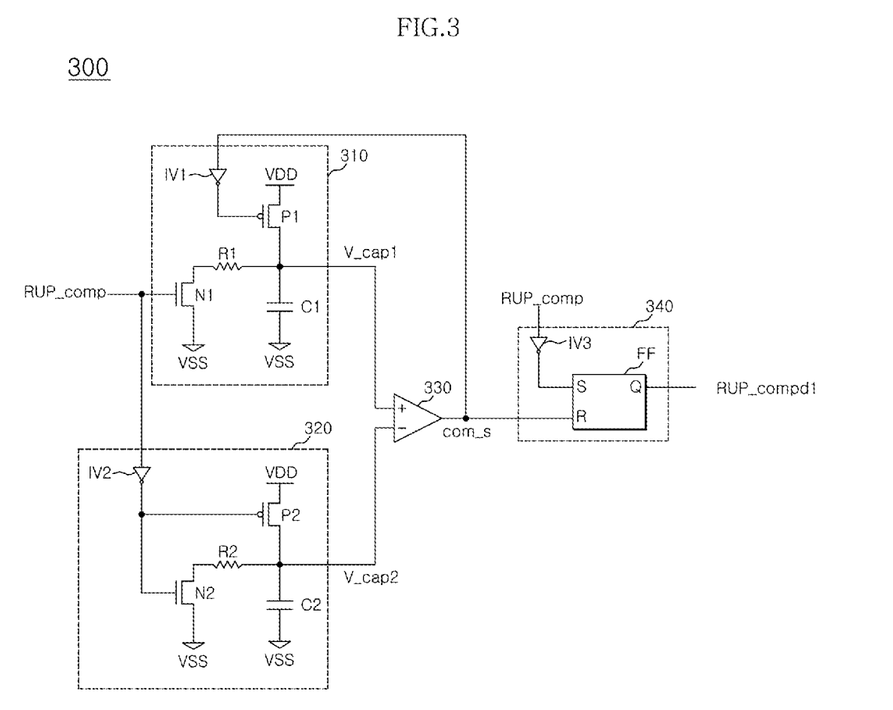
FIG. 3 is a configuration diagram of a first pulse shifting unit shown in FIG. 2.

Referring to FIG. 3, the first pulse shifting unit 300 includes charging/discharging sections 310 and 320, a comparing section 330, and a signal generating section 340. The charging/discharging sections 310 and 320 includes a first charging/discharging section 310 and a second charging/discharging section 320.

The first charging/discharging section 310 is configured to discharge a first capacitor C1 in response to the rupture instructing pulse signal RUP_comp, charge the first capacitor C1 in response to a comparison signal com_s, and output the voltage of the first capacitor C1 as a first cap voltage V_cap1. For example, the first charging/discharging section 310 discharges the first capacitor C1 when the rupture instructing pulse signal RUP_comp is enabled, and charges the first capacitor C1 when the comparison signal com_s is enabled.

The first charging/discharging section 310 includes a first inverter IV1, a first resistor R1, first and second transistors P1 and N1, and the first capacitor C1. The first inverter IV1 receives the comparison signal com_s. The first transistor P1 has a gate which is inputted with the output signal of the first inverter IV1 and a source which is applied with an external voltage VDD. The first capacitor C1 has one end to which the drain of the first transistor P1 is connected and an other end to which a ground terminal VSS is connected. The first resistor R1 has one end to which the one end of the first capacitor C1 is connected. The second transistor N1 has a gate which is inputted with the rupture instructing pulse signal RUP_comp, a drain to which an other end of the first resistor R1 is connected, and a source to which the ground terminal VSS is connected.

The second charging/discharging section 320 is configured to charge or discharge a second capacitor C1 in response to the rupture instructing pulse signal RUP_comp, and output a voltage of the second capacitor C2 as a second cap voltage V_cap2. For example, the second charging/discharging section 320 charges the second capacitor C2 when the rupture instructing pulse signal RUP_comp is enabled, and discharges the second capacitor C2 when the comparison signal com_s is disabled.

The second charging/discharging section 320 includes a second inverter IV2, third and fourth transistors P2 and N2, a second resistor R2, and the second capacitor C2. The second inverter IV2 receives the rupture instructing pulse signal RUP_comp. The third transistor P2 has a gate which is inputted with the output signal of the second inverter IV2 and a source which is applied with the external voltage VDD. The second capacitor C2 has one end to which the drain of the third transistor P2 is connected and an other end to which the ground terminal VSS is connected. The second resistor R2 has one end to which the one end of the second capacitor C2 is connected. The fourth transistor N2 has a gate which is inputted with the output signal of the second inverter IV2, a drain to which an other end of the second resistor R2 is connected and a source to which the ground terminal VSS is connected.

The comparing section 330 is configured to compare the levels of the first cap voltage V_cap1 and the second cap voltage V_cap2 and generate and output the comparison signal com_s. For example, the comparing section 330 enables the comparison signal com_s when the level of the first cap voltage V_cap1 is higher than the level of the second cap voltage V_cap2, and disables the comparison signal com_s when the level of the first cap voltage V_cap1 is lower than the level of the second cap voltage V_cap2. The comparing section 330 may be realized by a comparison circuit.

The signal generating section 340 is configured to generate the first delayed rupture instructing pulse signal RUP_compd1 in response to the rupture instructing pulse signal RUP_comp and the comparison signal com_s. For example, the signal generating section 340 enables the first delayed rupture instructing pulse signal RUP_compd1 when the rupture instructing pulse signal RUP_comp is disabled, and disables the first delayed rupture instructing pulse signal RUP_compd1 when the comparison signal com_s is enabled.

The signal generating section 340 includes a third inverter IV3 and an SR flip-flop FF. The third inverter IV3 receives the rupture instructing pulse signal RUP_comp. The SR flip-flop FF has an input terminal S which is inputted with the output signal of the third inverter IV3, a reset terminal R to which the comparison signal com_s is inputted, and an output terminal Q which outputs the first delayed rupture instructing pulse signal RUP_compd1.

Returning to FIG. 2, the second anti-fuse rupture unit 400 is configured to perform an operation for rupturing a second anti-fuse during the enable period of the first delayed rupture instructing pulse signal RUP_compd1, generate rupture information F_inf2 of the second anti-fuse, and output a second output signal OUT2.

The second anti-fuse rupture unit 400 includes a second anti-fuse section 410, a second blocking section 420, and a second sensing section 430.

The second anti-fuse section 410 is configured to perform a rupturing operation by applying preset voltages (for example, a positive pumping voltage and a negative pumping voltage) to the second anti-fuse during the enable period of the first delayed rupture instructing pulse signal RUP_compd1. The second anti-fuse section 410 having completed the rupturing operation outputs the rupture information of the second anti-fuse as a second fuse information signal F_inf2.

The second blocking section 420 is configured to prevent the preset voltages applied to the second anti-fuse from being transferred to the second sensing section 430, in response to the rupture period blocking signal RUP_cut. For example, the second blocking section 420 is interposed between the second anti-fuse section 410 and the second sensing section 430. The second blocking section 420 isolates the second anti-fuse section 410 and the second sensing section 430 from each other while the preset voltages are applied to the second anti-fuse in the second anti-fuse section 410 (during the enable period of the rupture period blocking signal RUP_cut). The second blocking section 420 connects the second anti-fuse section 410 and the second sensing section 430 with each other while the preset voltages are not applied to the second anti-fuse in the second anti-fuse section 410 (during the disable period of the rupture period blocking signal RUP_cut).

The second sensing section 430 is configured to sense the rupture information of the second anti-fuse, that is, the second fuse information signal F_inf2, and output a sensing result as the second output signal OUT2.

The second pulse shifting unit 500 is configured to delay the first delayed rupture instructing pulse signal RUP_compd1 and generate a second delayed rupture instructing pulse signal RUP_compd2. For example, the second pulse shifting unit 500 generates the second delayed rupture instructing pulse signal RUP_compd2 which is enabled at the disable timing of the first delayed rupture instructing pulse signal RUP_compd1 and has the substantially same enable period as the enable period of the first delayed rupture instructing pulse signal RUP_compd1.

Since the second pulse shifting unit 500 is configured in the substantially same way as the first pulse shifting unit 300 shown in FIG. 3, detailed descriptions thereof will be omitted herein.

The third anti-fuse rupture unit 600 is configured to perform an operation for rupturing a third anti-fuse during the enable period of the second delayed rupture instructing pulse signal RUP_compd2, generate rupture information F_inf3 of the third anti-fuse, and output a third output signal OUT3.

The third anti-fuse rupture unit 600 includes a second anti-fuse section 610, a third blocking section 620, and a third sensing section 630.

The third anti-fuse section 610 is configured to perform a rupturing operation by applying preset voltages (for example, a positive pumping voltage and a negative pumping voltage) to the third anti-fuse during the enable period of the second delayed rupture instructing pulse signal RUP_compd2. The third anti-fuse section 610 having completed the rupturing operation outputs the rupture information of the third anti-fuse as a third fuse information signal F_inf3.

The third blocking section 620 is configured to prevent the preset voltages applied to the third anti-fuse from being transferred to the third sensing section 630, in response to the rupture period blocking signal RUP_cut. For example, the third blocking section 620 is interposed between the third anti-fuse section 610 and the third sensing section 630. The third blocking section 620 isolates the third anti-fuse section 610 and the third sensing section 630 from each other while the preset voltages are applied to the third anti-fuse in the third anti-fuse section 610 (during the enable period of the rupture period blocking signal RUP_cut). The third blocking section 620 connects the third anti-fuse section 610 and the third sensing section 630 with each other while the preset voltages are not applied to the third anti-fuse in the third anti-fuse section 610 (during the disable period of the rupture period blocking signal RUP_cut).

The third sensing section 630 is configured to sense the rupture information of the third anti-fuse, that is, the third fuse information signal F_inf3, and output a sensing result as the third output signal OUT3.

Operations of the pulse shifting circuit and the semiconductor integrated circuit using substantially the same in accordance with an embodiment of the present invention, configured as mentioned above, will be described below.

Figure 4:
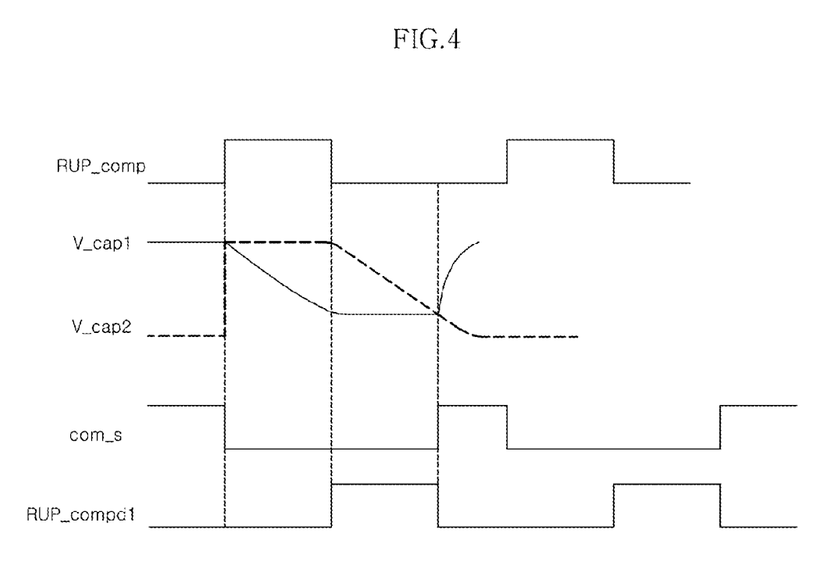
FIG. 4 is a timing diagram of the semiconductor integrated circuit in accordance with an embodiment of the present invention.

First, operations of the pulse shifting circuit in accordance with an embodiment of the present invention will be described with reference to FIG. 4. As shown in FIG. 4, the pulse shifting circuit in accordance with the embodiment of the present invention includes the first charging/discharging section 310, the second charging/discharging section 320, the comparing section 330, and the signal generating section 340. The pulse shifting circuit is illustrated as the pulse shifting units 300 and 400 in the semiconductor integrated circuit shown in FIG. 2.

An input pulse signal (shown as the rupture instructing pulse signal RUP_comp in FIG. 2 and hereinafter referred to as the rupture instructing pulse signal RUP_comp) is inputted to the pulse shifting circuit in accordance with an embodiment of the present invention. A delayed pulse signal outputted from the pulse shifting circuit in accordance with an embodiment of the present invention will be explained as the first delayed rupture instructing pulse signal RUP_compd1 as shown in FIG. 2.

In the case where the rupture instructing pulse signal RUP_comp is disabled to a low level, the second capacitor C2 of the second charging/discharging section 320 starts to discharge, and the second capacitor C2 voltage level V_cap2 decreases.

Therefore, if the second capacitor C2 voltage level V_cap2 becomes lower than first capacitor C1 voltage level V_cap1 of the first charging/discharging section 310 during the disable period of the rupture instructing pulse signal RUP_comp, the comparing section 330 outputs the comparison signal com_s which is enabled to a high level.

If the comparison signal com_s is enabled, the first capacitor C1 is charged. Also, if the comparison signal com_s is enabled, the signal generating section 340 disables the first delayed rupture instructing pulse signal RUP_compd1 to a low level.

In the case where the rupture instructing pulse signal RUP_comp is enabled to a high level, the first capacitor C1 starts to discharge and the first capacitor C1 voltage level V_cap1 decreases, whereas the second capacitor C2 is charged.

Thus, during the enable period of the rupture instructing pulse signal RUP_comp, the voltage level of the first capacitor C1 decreases, and the second capacitor C2 maintains a charged voltage level. Accordingly, if the rupture instructing pulse signal RUP_comp is enabled, the comparison signal com_s is disabled to a low level.

If the rupture instructing pulse signal RUP_comp is disabled to the low level, the first delayed rupture instructing pulse signal RUP_compd1 is enabled to a high level. Also, if the comparison signal com_s is disabled to the low level, the first capacitor C1 interrupts discharging and maintains its voltage level V_cap1, and simultaneously, since the rupture instructing pulse signal RUP_comp is disabled and the second capacitor C2 starts to discharge, the second capacitor C2 voltage level V_cap2 starts to decrease.

If the voltage level of the second capacitor C2 becomes lower than the voltage level of the first capacitor C1, the comparison signal com_s which has been disabled is enabled to the high level.

If the comparison signal com_s is enabled to the high level, the signal generating section 340 disables the first delayed rupture instructing pulse signal RUP_compd1 to the low level.

Namely, the pulse shifting circuit in accordance with the embodiment of the present invention performs operations to decrease the voltage level of the charged first capacitor during the enable period of the input pulse signal and to decrease the voltage level of the second capacitor when the input pulse signal is disabled. Also, if the voltage level of the second capacitor starts to decrease, that is, the input pulse signal is disabled, the delayed pulse signal is enabled, and, if the voltage level of the second capacitor becomes lower than the voltage level of the first capacitor, the delayed pulse signal is disabled.

Therefore, when decreasing the voltage levels of the first capacitor and the second capacitor, by flowing the charges charged in the first and second capacitors to a ground terminal by the substantially same current amount, the lengths of the enable periods of the input pulse signal and the delayed pulse signal become substantially the same.

The pulse shifting circuit in accordance with an embodiment of the present invention generates the delayed pulse signal which is enabled at the substantially same time when the input pulse signal is disabled, and the lengths of the enable periods of the input pulse signal and the delayed pulse signal become substantially the same.

Operations of the semiconductor integrated circuit using the pulse shifting circuit in accordance with an embodiment of the present invention will be described with reference to FIG. 2.

The fuse rupture command signal BST and the address ADD are inputted to the rupture determining section 110.

The rupture determining section 110 decodes the fuse rupture command signal BST and the address ADD and generates the fuse rupture determination signal RUP_dec.

The fuse rupture determination signal RUP_dec is inputted to the rupture instructing section 120.

The rupture instructing section 120 generates the rupture instructing pulse signal RUP_comp in response to the fuse rupture determination signal RUP_dec. For example, the rupture instructing section 120 generates the rupture instructing pulse signal RUP_comp when the fuse rupture determination signal RUP_dec is enabled.

The first anti-fuse section 210 is inputted with the rupture instructing pulse signal RUP_comp.

The first anti-fuse section 210 performs the rupturing operation of applying the preset voltages to the first anti-fuse during the enable period of the rupture instructing pulse signal RUP_comp.

While the first anti-fuse section 210 performs the rupturing operation, the first blocking section 220 isolates the first anti-fuse section 210 and the first sensing section 230 from each other. In other words, the first blocking section 220 prevents the preset voltages (for example, a high voltage) of the first anti-fuse section 210 which is performing the rupturing operation, from being transferred to the first sensing section 230 during the enable period of the rupture period blocking signal RUP_cut.

If the rupturing operation of the first anti-fuse section 210 is completed, that is, the rupture period blocking signal RUP_cut is disabled, the first blocking section 220 connects the first anti-fuse section 210 and the first sensing section 230 with each other.

If the first anti-fuse section 210 and the first sensing section 230 are connected with each other, the first sensing section 230 senses the first anti-fuse rupture information F_inf1 of the first anti-fuse section 210 and generates the first output signal OUT1. That is to say, the first sensing section 230 senses the first anti-fuse and outputs the rupture information F_inf1 of the first anti-fuse as the first output signal OUT1.

The first pulse shifting unit 300 has the substantially same configuration as the pulse shifting circuit described above.

The first pulse shifting unit 300 delays the rupture instructing pulse signal RUP_comp and outputs the first delayed rupture instructing pulse signal RUP_compd1. In detail, the first pulse shifting unit 300 enables the first delayed rupture instructing pulse signal RUP_compd1 when the rupture instructing pulse signal RUP_comp is disabled. The length of the enable period of the first delayed rupture instructing pulse signal RUP_compd1 may be substantially the same length as the enable period of the rupture instructing pulse signal RUP_comp.

The second anti-fuse section 410 is inputted with the first delayed rupture instructing pulse signal RUP_compd1.

The second anti-fuse section 410 performs the rupturing operation of applying the preset voltages to the second anti-fuse during the enable period of the first delayed rupture instructing pulse signal RUP_compd1.

While the second anti-fuse section 410 performs the rupturing operation, the second blocking section 420 isolates the second anti-fuse section 410 and the second sensing section 430 from each other. In other words, the second blocking section 420 prevents the preset voltages (for example, a high voltage) of the second anti-fuse section 410 which is performing the rupturing operation, from being transferred to the second sensing section 430 during the enable period of the rupture period blocking signal RUP_cut.

If the rupturing operation of the second anti-fuse section 410 is completed, that is, the rupture period blocking signal RUP_cut is disabled, the second blocking section 420 connects the second anti-fuse section 410 and the second sensing section 430 with each other.

If the second anti-fuse section 410 and the second sensing section 430 are connected with each other, the second sensing section 430 senses the rupture information F_inf2 of the second anti-fuse and generates the second output signal OUT2. That is to say, the second sensing section 430 senses the second anti-fuse and outputs the rupture information F_inf2 of the second anti-fuse as the second output signal OUT2.

The second pulse shifting unit 500 has the substantially same configuration as the pulse shifting circuit and the first pulse shifting unit described above.

The second pulse shifting unit 500 delays the first delayed rupture instructing pulse signal RUP_compd1 and outputs the second delayed rupture instructing pulse signal RUP_compd2. In detail, the second pulse shifting unit 500 enables the second delayed rupture instructing pulse signal RUP_compd2 when the first delayed rupture instructing pulse signal RUP_compd1 is disabled. The enable period of the second delayed rupture instructing pulse signal RUP_compd2 may be substantially the same as the enable period of the first delayed rupture instructing pulse signal RUP_compd1.

The third anti-fuse section 610 is inputted with the second delayed rupture instructing pulse signal RUP_compd2.

The third anti-fuse section 610 performs the rupturing operation of applying the preset voltages to the third anti-fuse during the enable period of the second delayed rupture instructing pulse signal RUP_compd2.

While the third anti-fuse section 610 performs the rupturing operation, the third blocking section 620 isolates the third anti-fuse section 610 and the third sensing section 630 from each other. In other words, the third blocking section 620 prevents the preset voltages (for example, a high voltage) of the third anti-fuse section 610 which is performing the rupturing operation, from being transferred to the third sensing section 630 during the enable period of the rupture period blocking signal RUP_cut.

If the rupturing operation of the third anti-fuse section 610 is completed, that is, the rupture period blocking signal RUP_cut is disabled, the third blocking section 620 connects the third anti-fuse section 610 and the third sensing section 630 with each other.

If the third anti-fuse section 610 and the third sensing section 630 are connected with each other, the third sensing section 630 senses the rupture information F_inf3 of the third anti-fuse and generates the third output signal OUT3. That is to say, the third sensing section 630 senses the third anti-fuse and outputs the rupture information F_inf3 of the third anti-fuse as the third output signal OUT3.

In an embodiment of the present invention, by realizing the semiconductor integrated circuit using the pulse shifting circuit, since two rupture determining sections and two rupture instructing sections may be removed from the three rupture determining sections and the three rupture instructing sections included in the semiconductor integrated circuit of FIG. 1 while performing the substantially same operations, areal efficiency may be improved.

While certain embodiments have been described above, it will be understood to those skilled in the art that the embodiments described are by way of example only. Accordingly, the pulse shifting circuit and the semiconductor integrated circuit described herein should not be limited based on the described embodiments. Rather, the pulse shifting circuit and the semiconductor integrated circuit described herein should only be limited in light of the claims that follow when taken in conjunction with the above description and accompanying drawings.

What is claimed is:

1. A pulse shifting circuit comprising:
    a first charging/discharging section configured to charge/discharge a first capacitor in response to an input pulse signal and a comparison signal;
    a second charging/discharging section configured to charge/discharge a second capacitor in response to the input pulse signal;
    a comparing section configured to compare voltage levels of the first capacitor and the second capacitor, and generate the comparison signal; and
    a signal generating section configured to generate a delayed pulse signal which is enabled at disable timing of the input pulse signal and has the substantially same enable period as an enable period of the input pulse signal, in response to the comparison signal and the input pulse signal,
    wherein the signal generating section comprises:
        an inverter configured to receive the input pulse signal; and
        an SR flip-flop configured to have an input terminal which is inputted with an output signal of the inverter, a reset terminal to which the comparison signal is inputted, and an output terminal which outputs the delayed pulse signal.

2. The pulse shifting circuit according to claim 1, wherein the first charging/discharging section charges the first capacitor during an enable period of the comparison signal, and discharges the first capacitor during the enable period of the input pulse signal.

3. The pulse shifting circuit according to claim 1, wherein the second charging/discharging section charges the second capacitor during the enable period of the input pulse signal, and discharges the second capacitor during a disable period of the input pulse signal.

4. The pulse shifting circuit according to claim 1, wherein the comparing section enables the comparison signal when the voltage level of the first capacitor is higher than the voltage level of the second capacitor, and disables the comparison signal when the voltage level of the first capacitor is lower than the voltage level of the second capacitor.

5. The pulse shifting circuit according to claim 1, wherein the signal generating section enables the delayed pulse signal when the input pulse signal is disabled, and disables the delayed pulse signal when the comparison signal is enabled.

6. A pulse shifting circuit comprising:
    a charging/discharging section configured to lower a voltage level of a first capacitor during an enable period of an input pulse signal, and lower a voltage level of a second capacitor when the input pulse signal is disabled;
    a comparing section configured to enable a comparison signal when a voltage level of the first capacitor becomes higher than a voltage level of the second capacitor; and
    a signal generating section configured to enable a delayed pulse signal when the input pulse signal is disabled, and disable the delayed pulse signal when the comparison signal is enabled,
    wherein the signal generating section comprises:
        an inverter configured to receive the input pulse signal; and
        an SR flip-flop configured to have an input terminal which is inputted with an output signal of the inverter, a reset terminal to which the comparison signal is inputted, and an output terminal which outputs the delayed pulse signal.

7. The pulse shifting circuit according to claim 6, wherein the charging/discharging section raises the voltage level of the first capacitor when the comparison signal is disabled, and raises the voltage level of the second capacitor when the input pulse signal is enabled.

* * * * *